United States Patent
Gang et al.

(10) Patent No.: US 9,007,355 B2
(45) Date of Patent: Apr. 14, 2015

(54) ORGANIC LIGHT EMITTING DISPLAY

(75) Inventors: Byeong Uk Gang, Paju-si (KR); Seung Tae Kim, Goyang-si (KR); Ji Eun Lee, Seoul (KR); Hong Suk Kim, Busan (KR)

(73) Assignee: LG Display Co., Ltd., Seoul (KR)

( * ) Notice: Subject to any disclaimer, the term of this patent is extended or adjusted under 35 U.S.C. 154(b) by 146 days.

(21) Appl. No.: 13/442,711

(22) Filed: Apr. 9, 2012

(65) Prior Publication Data

US 2013/0106817 A1 May 2, 2013

(30) Foreign Application Priority Data

Oct. 31, 2011 (KR) ......................... 10-2011-0112538

(51) Int. Cl.
- G06F 3/038 (2013.01)
- G02F 1/061 (2006.01)
- H01L 27/32 (2006.01)
- G09G 3/32 (2006.01)

(52) U.S. Cl.
CPC *G02F 1/061* (2013.01); *G09G 3/32* (2013.01); *H01L 27/3276* (2013.01)
USPC .............. 345/211; 345/213; 345/82; 345/83; 345/76; 345/100; 445/25

(58) Field of Classification Search
CPC ................... G09G 2330/021; G09G 2330/02; G09G 3/3696; G09G 3/3648; G09G 3/3688
USPC ................. 345/211–213, 82–83, 76, 100, 690
See application file for complete search history.

(56) References Cited

U.S. PATENT DOCUMENTS

| 6,014,191 | A | * | 1/2000 | Kim et al. | ........................ 349/54 |
| 7,884,786 | B2 | | 2/2011 | Kim et al. | |
| 2006/0123293 | A1 | * | 6/2006 | Kim et al. | ..................... 714/724 |
| 2007/0075943 | A1 | * | 4/2007 | Shin et al. | ....................... 345/84 |
| 2007/0080433 | A1 | | 4/2007 | Lai | |
| 2009/0121973 | A1 | | 5/2009 | Kim et al. | |

FOREIGN PATENT DOCUMENTS

| CN | 101430861 A | 5/2009 |
| DE | 103 60 454 A1 | 8/2004 |
| KR | 10-2011-0070165 | 6/2011 |

OTHER PUBLICATIONS

United Kingdom Patent Office, Search and Examination Report, UK Application No. GB 1209691.3, Sep. 14, 2012, five pages.
German Patent and Trademark Office, Office Action, German Patent Application No. 10 2012 209 053.3, Feb. 14, 2014, twelve pages.
State Intellectual Property Office of the People's Republic of China, Office Action, Chinese Patent Application No. 201210142798.4, eight pages [with concise explanation of relevance in English].

* cited by examiner

*Primary Examiner* — Shaheda Abdin
(74) *Attorney, Agent, or Firm* — Fenwick & West LLP

(57) ABSTRACT

An OLED device is disclosed that enhances display quality by minimizing capacitance deviation between data lines of the OLED device. The capacitance deviation may be minimized by utilizing an expansion portion of a power line of the OLED device. The capacitance deviation may also by minimized by utilizing an overlap pattern that overlaps a plurality of the data lines.

17 Claims, 8 Drawing Sheets

ORGANIC LIGHT EMITTING DISPLAY

CROSS-REFERENCE TO RELATED APPLICATION

This application claims priority under 35 U.S.C. 119(a) of Korean Patent Application No. 10-2011-0112538, filed on Oct. 31, 2011, which is hereby incorporated by reference in its entirety.

BACKGROUND

1. Technical Field

The embodiments described herein relate to an organic light emitting display (OLED) device.

2. Description of the Related Art

Devices for displaying information are being widely developed. Display devices may include liquid crystal display (LCD) devices, organic light emitting display (OLED) devices, electrophoresis display devices, field emission display (FED) devices, and plasma display devices.

Among these display devices, OLED devices provide features of lower power consumption, larger viewing angle, light weight, and higher brightness compared to LCD devices. Thus, OLED devices are being spotlighted as next generation display devices.

An OLED device includes gate lines and data lines formed on a substrate in the same shape as a LCD device. Moreover, the OLED device includes a plurality of power lines used for applying power to each pixel, unlike the LCD device that uses a single power line. The gate lines, the data lines, and the power supply lines are formed in different layers from one another. Thus, the gate lines, the data lines, and the power supply lines create a plurality of intersections by crossing one another.

In addition, the recent trend of light weight display devices increases the intersections of the gate lines, the data lines, and the power supply lines. Due to the increase of intersections, an RC delay caused by a parasitic capacitor may be aggravated. The enlarged parasitic capacitor deteriorates the display quality through the distortion of signals.

SUMMARY

Accordingly, the embodiments herein are directed to an OLED device that substantially obviates one or more of problems due to the limitations and disadvantages of the related art, and to a method of manufacturing the same.

The embodiments discussed herein provide an OLED device adapted to enhance display quality. In one embodiment, the OLED device enhances display quality by minimizing capacitance deviation between data lines of the OLED device. The capacitance deviation may be minimized by utilizing an expansion portion of a power line of the OLED device. The capacitance deviation may also by minimized by utilizing an overlap pattern that overlaps a plurality of the data lines.

According to one embodiment, an OLED device includes a data driver configured with at least one driver integrated circuit (IC) chip, a plurality of data lines electrically coupled to the driver IC chip, at least one power line formed in a direction crossing the data lines, at least one link line used to connect the power line with the driver IC chip, and an overlap pattern formed to overlap with at least part of the data lines between the power line and the driver IC chip.

The features and advantages described in this summary and the following detailed description are not intended to be limiting. Many additional features and advantages will be apparent to one of ordinary skill in the art in view of the drawings, specification and claims.

The drawings depict, and the detail description describes, various non-limiting embodiments for purposes of illustration only. One skilled in the art will readily recognize from the following discussion that alternative embodiments of the structures and methods illustrated herein may be employed without departing from the principles described herein.

DETAILED DESCRIPTION

In the present disclosure, it will be understood that when an element, such as a substrate, a layer, a region, a film, or an electrode, is referred to as being formed "on" or "under" another element in the various embodiments described herein, the element may be directly on or under the other element, or intervening elements (indirectly) may be present. Note that the term "on" or "under" an element may include the meanings of "an upward direction" or "a downward direction" in the center of the element.

Figure 1:
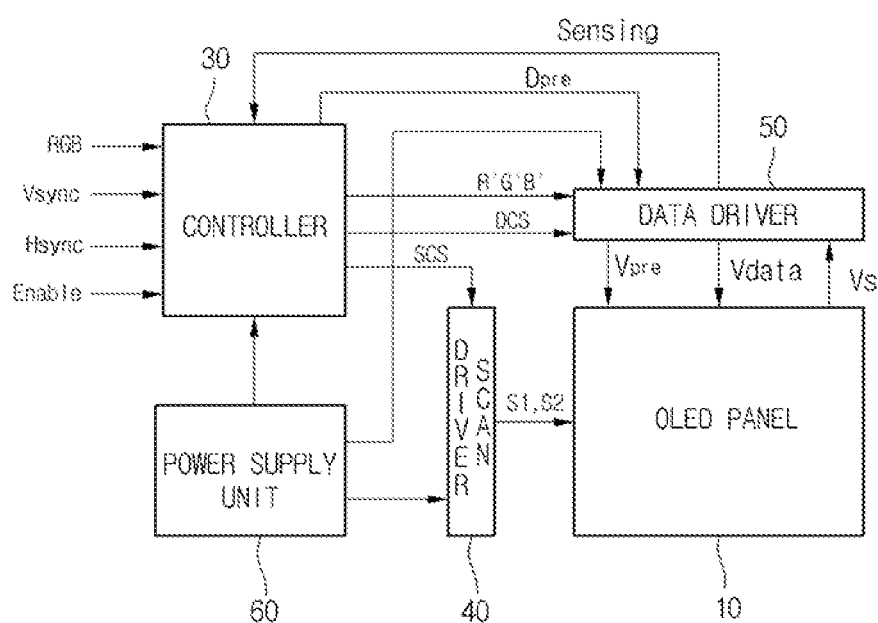
FIG. 1 illustrates a block diagram of an OLED device according to one embodiment.

FIG. 1 illustrates a block diagram of an OLED device according to one embodiment. The OLED device comprises an OLED panel 10, a controller 30, a scan driver 40, a data driver 50 and a power supply unit 60. The scan driver 40 may apply first scan signals S1 and second scan signals S2 to the OLED panel 10. The data driver 50 may apply data voltages "Vdata" to the OLED panel 10. The power supply unit 60 may apply a plurality of drive voltages to the controller 30, the scan driver 40, and the data driver 50.

Although not shown in FIG. 1, the OLED panel 10 comprises a plurality of scan lines, a plurality of data lines, and a plurality of power supply lines. A plurality of pixel regions can be defined by the intersection of the scan lines and the data lines.

Each of the pixel regions may be electrically coupled to a scan line, a data line, and a power supply line. For example, a scan line may be electrically coupled to a plurality of pixel regions arranged in a horizontal direction, and the data lines may be electrically coupled to the plurality of pixel regions arranged in a vertical direction.

A pixel region may receive a first scan signal S1, a second scan signal S2, a pre-charge data voltage Vpre, a data voltage Vdata, a first power supply voltage VDD, and a second power supply voltage VSS. More specifically, the first scan signals S1 and the second scan signals S2 may be sequentially applied to the pixel region through their respective scan lines. The pre-charge data voltage Vpre may be sequentially applied to the pixel region through the respective data line. The first power supply voltage VDD and the second power supply voltage VSS can be applied to the pixel region through the respective power supply lines. A sensing voltage Vs for a node within the pixel region can be supplied from the pixel region to the data driver 50 of FIG. 1 through the respective data line.

Figure 2:
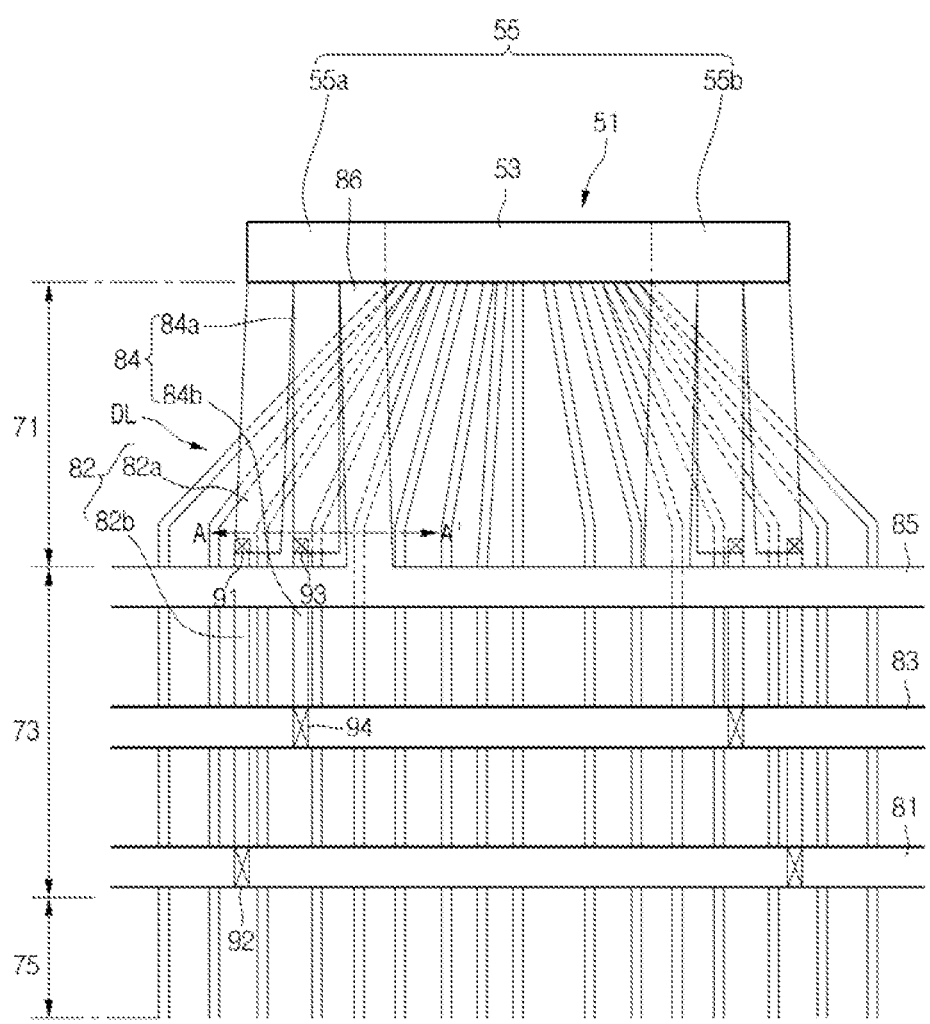
FIG. 2 illustrates a planar view of a data link portion of an OLED device according to one embodiment.

FIG. 2 illustrates a planar view of a data link portion of the OLED device according to one embodiment. The data link portion of the OLED device shown in FIG. 2 may include a plurality of driver IC chips. However, for convenience of explanation, the data link portion in FIG. 2 is shown to include only a single driver IC chip 51 among the plurality of driver IC chips.

In one embodiment, the driver IC chip 51 comprises a signal domain 53 occupying a central portion of the driver IC chip 51. The signal domain 53 receives image signals from the controller 30 of FIG. 1 and supplies the received image signals to the OLED panel 10.

The driver chip 51 also includes power domains 55 positioned at both sides (i.e., ends) of the signal domain 53. The power domains 55 receive power voltages from the power supply unit 60 of FIG. 1 and apply the received voltages to the OLED panel 10. The power domains 55 may include a first power domain 55a positioned at one side of the driver IC chip 51 and a second power domain 55b positioned at the other side of the driver IC chip 51.

A display area 75 may be used for displaying images and can be positioned below the driver IC chip 51. A first link area 71 and a second link area 73 can be positioned between the driver IC chip 51 and the display area 75. The first link area 71 is an area between the driver IC chip 51 and the second link area 73. The second link area 73 is another area between the first link area 71 and the display area 75.

First power line 81, second power line 83, and third power line 85 can be formed in the second link area 73. The first through third power lines 81, 83 and 85 can be formed to extend along a first direction that is the same as the major axis of the driver IC chip 51.

The plurality of data lines DL can be formed to extend along a second direction perpendicular to the first direction and cross the first link area 71 and second link area 73. One end of the plurality of data lines DL can be electrically coupled to the signal domain 53 of the driver IC chip 51. The other end of the plurality of data lines DL extend to the inside of the OLED panel 10.

A part of a first link line 82, a part of a second link line 84, and a third link line 86 can be formed in the first link area 71. The first link line 82 can include a first upper link line 82a and a first lower link line 82b. The second link line 84 can include a second upper link line 84a and a second lower link line 84b. The first upper link line 82a, the second upper link line 84a, and the third link line 86 provided in the first link area 71 extend along the second direction.

In one embodiment, the first link line 82 electrically connects the power domain 55 of the driver IC chip 51 with the first power line 81. The second link line 84 may electrically connect the power domain 55 of the driver IC chip 51 with the second power line 83. The third link line 86 may electrically connect the power domain 55 of the driver IC chip 51 with the third power line 85.

One end of the first upper link line 82a can be electrically coupled to the power domain 55 of the driver IC chip 51 and the other end of the first upper link line 82a can be electrically coupled to the first lower link line 82b through a first contact hole 91. One end of the first lower link line 82b can be electrically coupled to the first upper link line 82a and the other end of the first lower link line 82b can be electrically coupled to the first power line 81 through a second contact hole 92.

One end of the second upper link line 84a can be electrically coupled to the power domain 55 of the driver IC chip 51 and the other end of the second upper link line 84a can be electrically coupled to the second lower link line 84b through a third contact hole 93. One end of the second lower link line 84b can be electrically coupled to the second upper link line 84a, and the other end of the second lower link line 84b can be electrically coupled to the second power line 83 through a fourth contact hole 94.

The first link line 82, the second link line 84, and the third link line 86 can be symmetrically coupled to both power domains of the driver IC chip 51. In other words, the first through third link lines 82, 84 and 86 can be symmetrically coupled to both the first power domain 55a and second power domain 55b which are positioned at both sides of the driver IC chip 51.

The power voltages generated in the power supply unit 60 of FIG. 1 can be applied to the first power line 81, second power line 83, and third power line 85 through the power domain 55 of the driver IC chip 51 and through the first link line 82, second link line 84, and the third link line 86. The power voltage applied to each of the first through third power lines 81, 83 and 85 can be applied to the pixel regions on the OLED panel 10 through a line not shown in FIG. 2.

In one embodiment, a first power voltage applied to the first power line 81 can be a reference voltage Vref. A second power voltage applied to the second power 83 may be a ground voltage. A third power voltage applied to the third power line 85 may be a supply voltage VDD.

The first through third power lines 81, 83 and 85, the first and second upper link lines 82a and 84a, and the third link line 86 may be formed in the same layer. The first through third power lines 81, 83 and 85, the first and second upper link lines 82a and 84a, and the third link line 86 can be formed from a data metal.

The data lines DL and the first lower link line 82b and the second lower link line 84b can be formed in the same layer. The data lines DL and the first lower link line 82b, and the second lower link line 84b can be formed in a different layer from the first through third power lines 81, 83 and 85, the first and second upper link lines 82a and 84a, and the third link line 86. The data lines DL and the first and second lower link lines 82b and 84b can be formed from a gate metal. The gate metal and the data metal may be a metal material including at least one of titanium Ti, chrome Cr, nickel Ni, aluminum Al, platinum Pt, gold Au, tungsten W, copper Cu and molybdenum Mo. Other metal materials may be used in different embodiments.

The data voltages being output from the driver IC chip 51 are transferred to a wider area than that of the driver IC chip 51. As such, the data lines DL horizontally spread (i.e., fan out) as the data lines DL go from the top edge of the first link area 71 toward the bottom edge of the first link area 71. The top ends of the data lines DL are limited to a narrower dimension than that of the width of the signal domain 53 of the driver IC chip 51 because the top ends of the data lines DL are coupled to the signal domain 53 of the driver IC chip 51. On the other hand, the bottom ends of the data lines DL must be formed to have the same thickness and are widely spaced apart from one another with a fixed interval due to applying the data voltages to the wider area.

The data lines DL can overlap with the first through third link lines 82, 84 and 86. More specifically, the data lines DL can overlap with the first upper link lines 82a, the second upper link lines 84a, and the third link line 86. This overlap of the data lines DL with the link lines causes parasitic capacitors to be formed.

Figure 3:
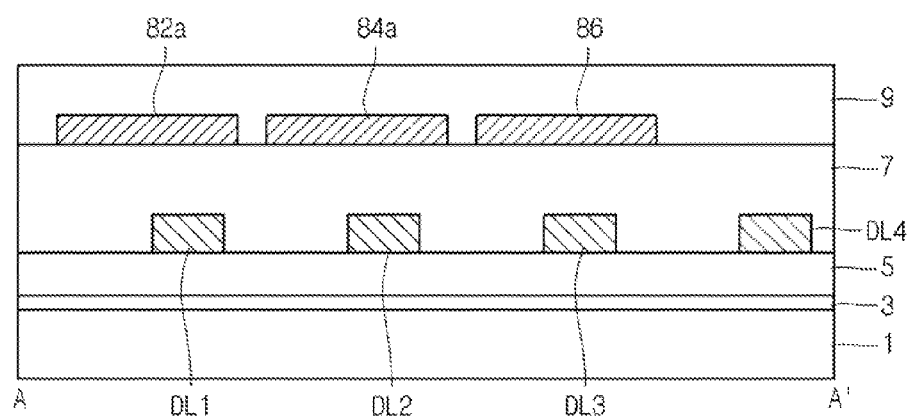
FIG. 3 illustrates a cross-sectional view showing the data link portion of the OLED device shown in FIG. 2 according to one embodiment.

FIG. 3 illustrates a cross-sectional view showing the data link portion of the OLED device taken along a line A-A' in FIG. 2. The data link portion of the OLED device according to the embodiment shown in FIG. 2 may include a substrate 1, a buffer layer 3 on the substrate 1, and a gate insulation film 5 on the buffer layer 3.

In one embodiment, the gate insulation film 5 is used for electrically insulating data lines from a different layer. As such, the gate insulation film 5 must have superior dielectric properties. Therefore, the gate insulation film 5 can be formed to include either an inorganic insulation material such as silicon nitride SiNx or silicon oxide SiOx, or an organic insulation material such as benzocyclobutene (BBC). Other materials may be used in different embodiments.

A plurality of data lines DL can be formed on the gate insulation film 5. The plurality of data lines DL can include a first data line DL1, a second data line DL2, a third date line DL3, and a fourth data line DL4. The data lines DL can be formed from a data metal.

An insulation layer 7 can be formed on the gate insulation film 5 provided with the data lines DL. The insulation layer 7 is used for insulating the data lines DL from a metal layer that is different from the data lines DL. As such, the insulation layer 7 must have superior dielectric properties. Therefore, the insulation layer 7 may be formed to include either an inorganic insulation material such as silicon nitride SiNx or silicon oxide SiOx, or an organic insulation material such as benzocyclobutene (BBC). Other materials may be used in different embodiments.

The first through third link lines 82, 84 and 86 may be formed on the insulation layer 7. More specifically, first upper link line 82a, the second upper link line 84a, and the third link line 86 may be formed on the insulation layer 7. The first and second upper link lines 82a and 84a and the third link line 86 can be formed from a data metal.

A protective layer 9 may be formed on the insulation layer 7 provided with the first and second upper link lines 82a and 84a and the third link line 86. The protective layer 9 is used to protect the first and second upper link lines 82a and 84a and the third link line 86 from the exterior and prevent the first and second upper link lines 82a and 84a and the third link line 86 from contacting an external material or object. As such, the protective layer 9 must have superior dielectric properties. Therefore, the protective layer 9 may be formed to include either an inorganic insulation material such as silicon nitride SiNx or silicon oxide SiOx, or an organic insulation material such as benzocyclobutene (BBC). Other materials may be used in different embodiments.

As shown in FIG. 3, the first data line DL1 can overlap with the first upper link line 82a, the second data line DL2 can overlap with the second upper link line 84a, and the third data line DL3 can overlap with the third link line 86. The overlap of the data lines DL with the link lines causes parasitic capacitances to be generated. However, the capacitance does not exist in the fourth data line DL4 because the fourth data line DL4 does not overlap with any of the link lines. Thus, an imbalance of the capacitance is caused between the data lines DL.

Figure 4:
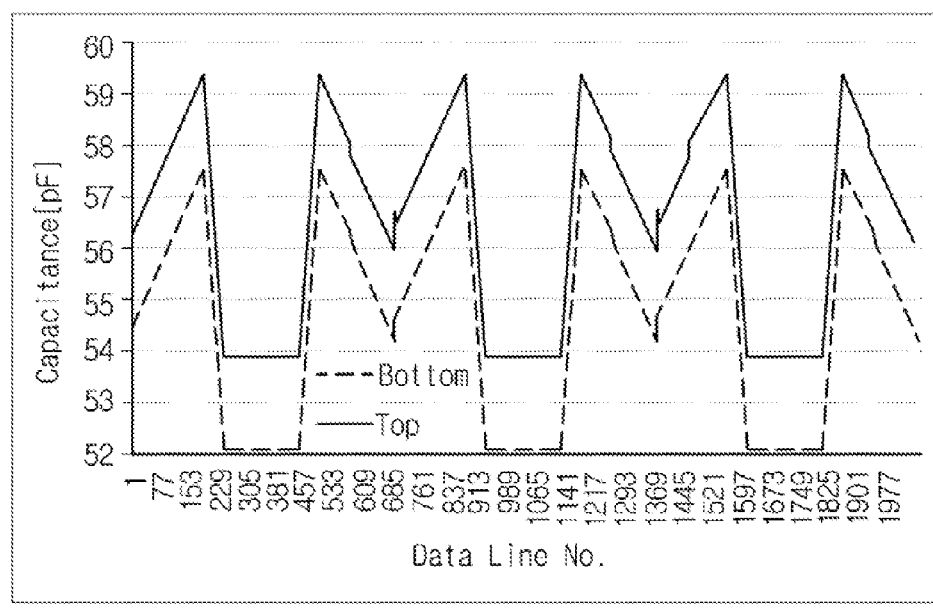
FIG. 4 illustrates a data sheet of the capacitance characteristic of the data line of the OLED device shown in FIG. 2 according to the embodiment.

FIG. 4 illustrates a data sheet of the capacitance characteristic of the data lines of the OLED device shown in FIG. 2 according to the embodiment. As shown in FIG. 4, the capacitances of the data lines included in the OLED device rise and fall periodically and repeatedly.

Minimum capacitance portions in FIG. 4 correspond to regions of the first link area 71 opposite to the signal domain 53 of the driver IC chip 51 in FIG. 2. The data lines existing in the regions of the first link area 71 opposite to the signal domain 53 of the driver IC chip 51 have a small capacitance due to not overlapping with the link line.

The rising and falling capacitance portions in FIG. 4 correspond to the other regions of the first link area opposite to the power domain 55, more specifically the edge portions of the driver IC chip 51 in FIG. 2. In the regions of the first link area opposite to the power domain 55 of the driver IC chip 51, the data lines DL have an increased capacitance due to the overlap with the link lines. Such irregular capacitance causes variation in the resistor-capacitor (RC) delay. Due to this, signals are distorted resulting in the deterioration of display quality.

Figure 5:
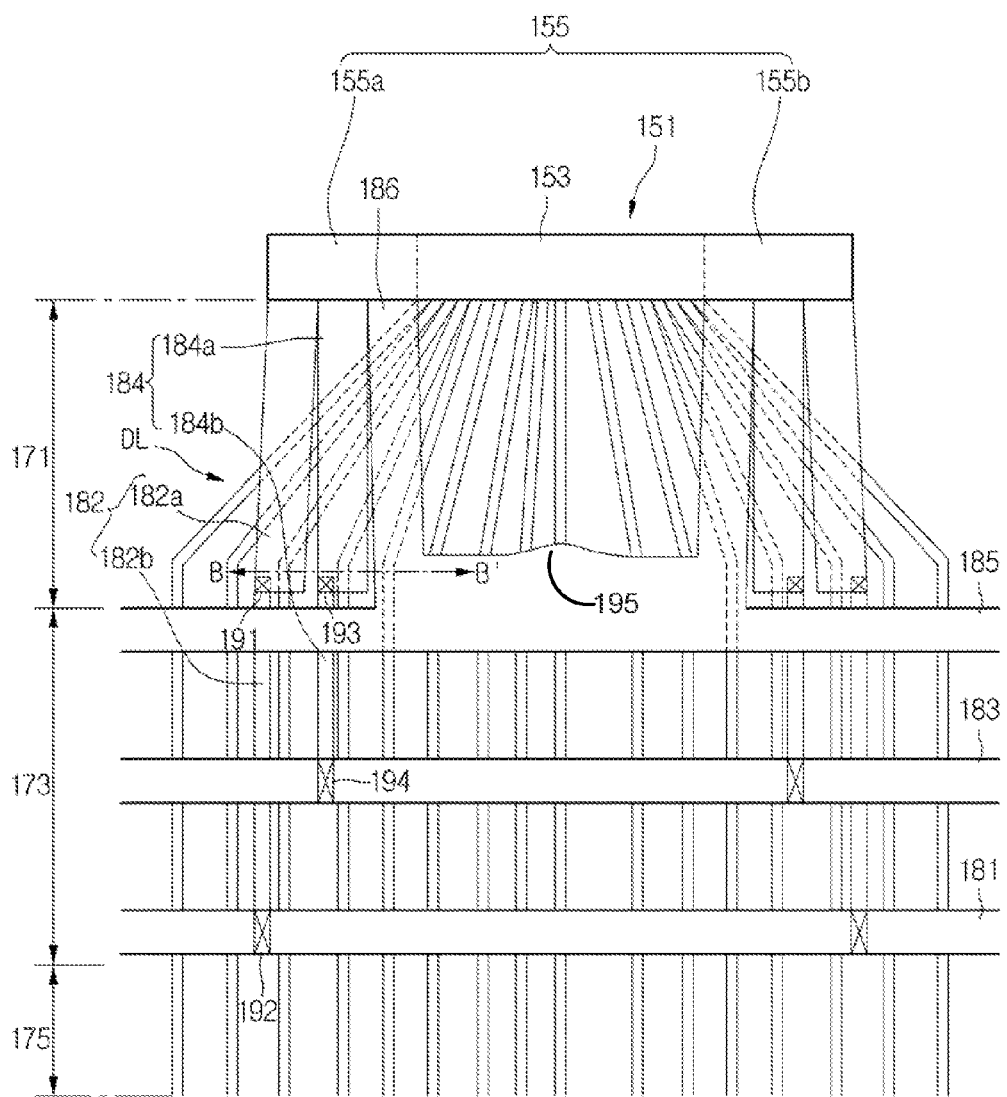
FIG. 5 illustrates a planar view of a data link portion of the OLED device according to one embodiment.

FIG. 5 illustrates a planar view of a data link portion of the OLED device according to an alternative embodiment. The embodiment shown in FIG. 5 is similar to the embodiment shown in FIG. 2 with the exception of allowing the third power line to extend toward the driver IC chip 151. Therefore, the descriptions of the embodiment of FIG. 2 repeated in FIG. 5 will be omitted for ease of discussion.

Referring to FIG. 5, a driver IC chip 151 of the OLED device comprises a signal domain 153 occupying a central portion of the driver IC chip 151 and power domains 155 positioned at both sides (i.e., ends) of the signal domain 153.

A display area 175 used for displaying images can be provided below the driver IC chip 151. A first link area 171 and a second link area 173 can be provided between the driver IC chip 151 and the display area 175.

A first power line 181, a second power line 183, and a third power line 185 can be formed in the second link area 173. The first through third power line 181, 183 and 185 can be formed to extend along a first direction that is the same as the major axis of the driver IC chip 151.

The plurality of data lines DL can be formed to extend along a second direction perpendicular to the first direction and cross the first and second link area 171 and 173. One end of the plurality of data lines DL are electrically coupled to the signal domain 153 of the driver IC chip 151. The other end of the plurality of data lines DL extend to the inside of the OLED panel 10.

A part of a first link line 182, a part of a second link line 184, and a third link line 186 can be formed in the first link area 171. The first link line 182 includes a first upper link line 182a and a first lower link line 182b. The second link line 184 includes a first upper link line 184a and a first lower link line 184b. The first upper link line 182a, the second upper link line 184a, and the third link line 186 provided in the first link area 171 can be formed to extend along the second direction.

The first link line 182 can electrically connect the power domain 155 of the driver IC chip 151 with the first power line 181. The second link line 184 can electrically connect the power domain 155 of the driver IC chip 151 with the second power line 183. The third link line 186 can electrically connect the power domain 155 of the driver IC chip 151 with the third power line 185.

One end of the first upper link line 182a can be electrically coupled to the power domain 155 of the driver IC chip 151 and the other end of the first upper link line 182a can be electrically coupled to the first lower link line 182b through a first contact hole 191. One end of the first lower link line 182b can be electrically coupled to the first upper link line 182a and the other end of the first lower link line 182b can be electrically coupled to the first power line 181 through a second contact hole 192.

One end of the second upper link line 184a can be electrically coupled to the power domain 155 of the driver IC chip 151 and the other end of the second upper link line 184a can be electrically coupled to the second lower link line 184b through a third contact hole 193. One end of the second lower link line 184b can be electrically coupled to the second upper link line 184a, and the other end of the second lower link line 184b can be electrically coupled to the second power line 183 through a fourth contact hole 194.

The data lines DL can overlap with the first through third link lines 182, 184 and 186. More specifically, the data lines DL can overlap with the first link line 182a and the second upper link line 184a, and the third link line 186. This overlap of the data lines DL with the link lines causes formation of parasitic capacitors.

In one embodiment, the third power line 185 includes an expansion portion which expands one edge of the third power line facing the signal domain 153 of the driver IC chip 155 toward the inside of the first link area 171. The expansion portion of the third power 185 can be formed in such a manner that the central domain of the edge of the end of the expansion portion protrudes 195. Note that in other embodiments, the expansion portion may expand one edge of the third power line that is not facing the signal domain 153 of the driver IC chip 155. The expansion portion of the third power line 185 expanding to the inside of the first link area 171 can overlap with the data lines DL within the first link area 171. The expansion portion of the third power line 185 can be formed in a size suitable to minimize a capacitance deviation between the data lines DL coupled to the power domain 153 and the outside domain thereof of the driver IC chip 151 so that the capacitances formed across the data lines DL are substantially equal. Also, the expansion portion of the third power line 185 can be formed in such a manner as to consider a resistance deviation caused by a difference between the data lines DL, so that a RC delay deviation between the data lines is minimized. Note that a data line coupled to the center of the signal domain 153 of the driver IC chip 151 has a lower line resistance than that of another data line coupled to the outside of the signal domain 153 due to having a shorter length. Thus, the expansion portion of the third power line 185 can be formed in such a manner that the central domain of the edge of the end of the expansion portion protrudes 195. The expansion portion of the third power line 185 with the protruding end edge 195 can reduce the RC delay deviation between the data lines DL. The extension portion of the third power line 185 may be formed in the entire or a part of the first link area 171.

Also, although not shown in the drawings, a data line with a shorter relative distance (e.g., a data line coupled to the center of the signal domain 53) from the signal domain 153 to the third power line 185 can be formed in an irregular (e.g., zigzagged) shape so that the path length of the data line is the same as the path length of a data line with a longer relative distance from the signal domain 153 to the third power line 185 (e.g., a data line coupled to the end of the signal domain 53), in order to reduce the resistance difference between the other data lines with a relatively long length. By having the data lines have the same path length, the data lines have substantially the same resistance. The length deviation can be reduced by forming a part of the data lines in the irregular shape, and possibly reducing the resistance deviation between the data lines.

Figure 6A:
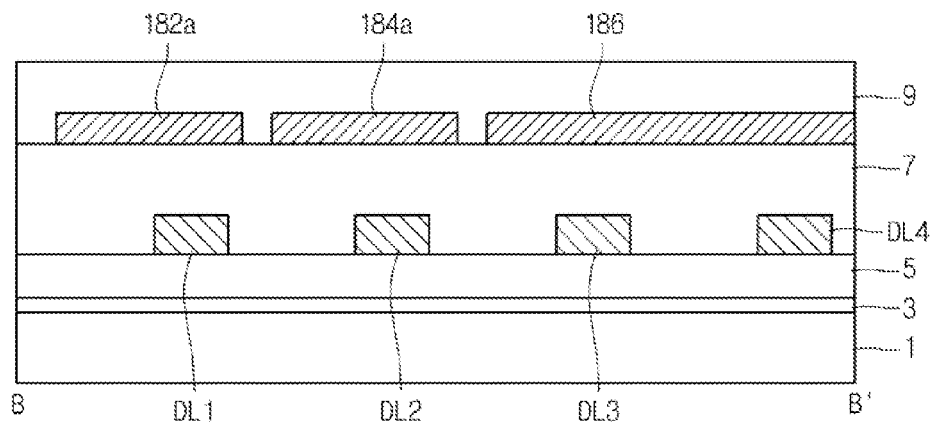
FIG. 6A illustrates a cross-sectional view showing the data link portion of the OLED device shown in FIG. 5 according to one embodiment.

FIG. 6A illustrates a cross-sectional view showing the data link portion of the OLED device taken along a line B-B' in FIG. 5. The data link portion of the OLED device shown in FIG. 5 may include a substrate 1, a buffer layer 3 on the substrate 1, and a gate insulation film 5 on the buffer layer 3.

A plurality of data lines DL can be formed on the gate insulation film 5. The plurality of data lines DL can include a first data line DL1, a second data line DL2, a third data line DL3, and a fourth data line DL4. An insulation layer 7 may be formed on the gate insulation film 5 over the plurality of data lines DL.

The first link line 182, second link line 184, and the third link line 186 may be formed on the insulation layer 7. More specifically, the first upper link line 182a and the second upper link line 184a and the third link line 186 can be formed on the insulation layer 7.

A protective layer 9 can be formed on the insulation layer 7 provided with the first upper link line 182a and the second upper link line 184a and the third link line 186.

The first data line DL1 can overlap with the first upper link line 182a. The second data line DL2 can overlap with the second upper link line 184a. The third data line DL3 and the fourth link line DL4 can both overlap with the third link line 186. More specifically, the fourth data line DL4 can overlap with the expansion portion which is formed to expand from the third power line 185 coupled to the third link line 186.

The overlap of the data lines DL with the link lines causes parasitic capacitances to be generated. The overlap of the fourth data line DL4 with the expansion portion of the third power line 185 can reduce a deviation between the capacitances. As such, the RC delay quantities of the data lines DL can substantially match one another resulting in the enhancement of the display quality of the OLED device.

Figure 7:
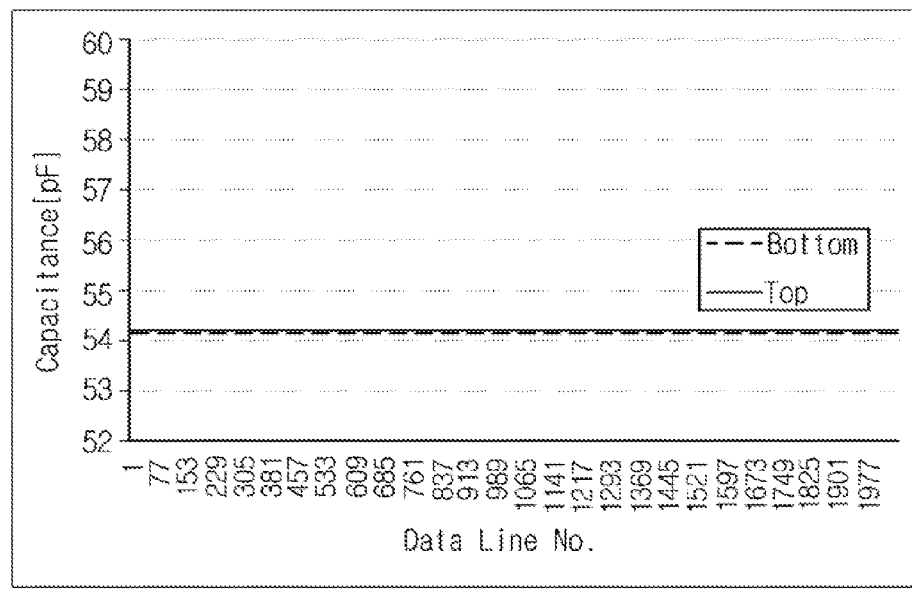
FIG. 7 illustrates a data sheet of the capacitance characteristic of the data line of the OLED device shown in FIG. 5 according to the embodiment.

FIG. 7 illustrates a data sheet of the capacitance characteristic of the data lines DL of the OLED device shown in FIG. 5 according to the embodiment. As shown in FIG. 7, the data lines included in the OLED device have a fixed line capacitance. Note that the capacitance values illustrated in FIG. 7 are for exemplary purposes only and the data lines DL may have other capacitance values than those illustrated in FIG. 7. The OLED device shown in FIG. 5 maintains the capacitances of the data lines DL regardless of the positions of the data lines, unlike that of the embodiment shown in FIG. 2. This results because the deviation between the data lines is reduced by overlapping the data lines, which are coupled to the signal domain of the driver IC chip 151 with the expansion portion of the third power line 185. The data lines with a fixed capacitance can have a fixed RC delay quantity. Therefore, the distortion of signals can be prevented and the display quality of the OLED device is enhanced.

Figure 6B:
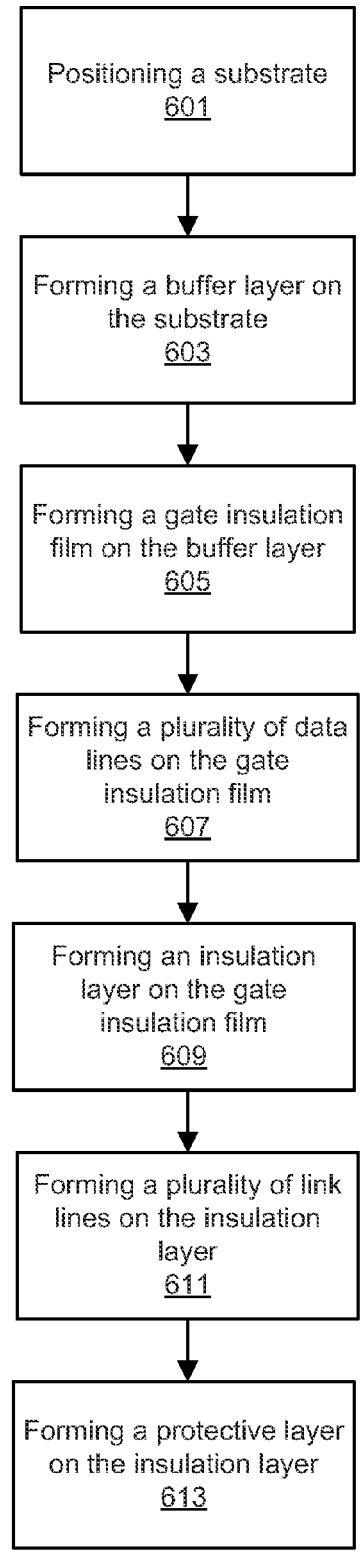
FIG. 6B illustrates a method for manufacturing the OLED device according to one embodiment.

FIG. 6B illustrates a method for manufacturing the OLED device shown in FIG. 6A. Note that in other embodiments, other steps may be performed.

In one embodiment, the method comprises positioning 601 (i.e., placing) a substrate and forming 603 a buffer layer on the substrate. The method further comprises forming 605 a gate insulation film on the buffer layer and forming 607 a plurality of data lines on the gate insulation film. The plurality of data lines may include the first data line DL1, the second data line DL2, the third data line DL3, and the fourth data line DL4 shown in FIG. 6A. The method also comprises forming 609 an insulation layer on the gate insulation film. The insulation layer may be formed over the plurality of data lines. The method further comprises forming 611 a plurality of link lines on the insulation layer. Specifically, the first link line 182, second link line 184, and the third link line 186 may be formed on the insulation layer as shown in FIG. 6A.

Note that the first data line DL1 is formed to overlap with the first upper link line 182a. Similarly, the second data line DL2 is formed to overlap with the second upper link line 184a. Both the third data line DL3 and the fourth link line DL4 are formed to overlap with the third link line 186. More specifically, the fourth data line DL4 is formed to overlap with the expansion portion which is formed to expand from the third power line 185 coupled to the third link line 186. The method shown in FIG. 6B further comprises forming 613 a protective layer on the insulation layer. The protective layer may be formed over the plurality of link lines in one embodiment.

Figure 8:
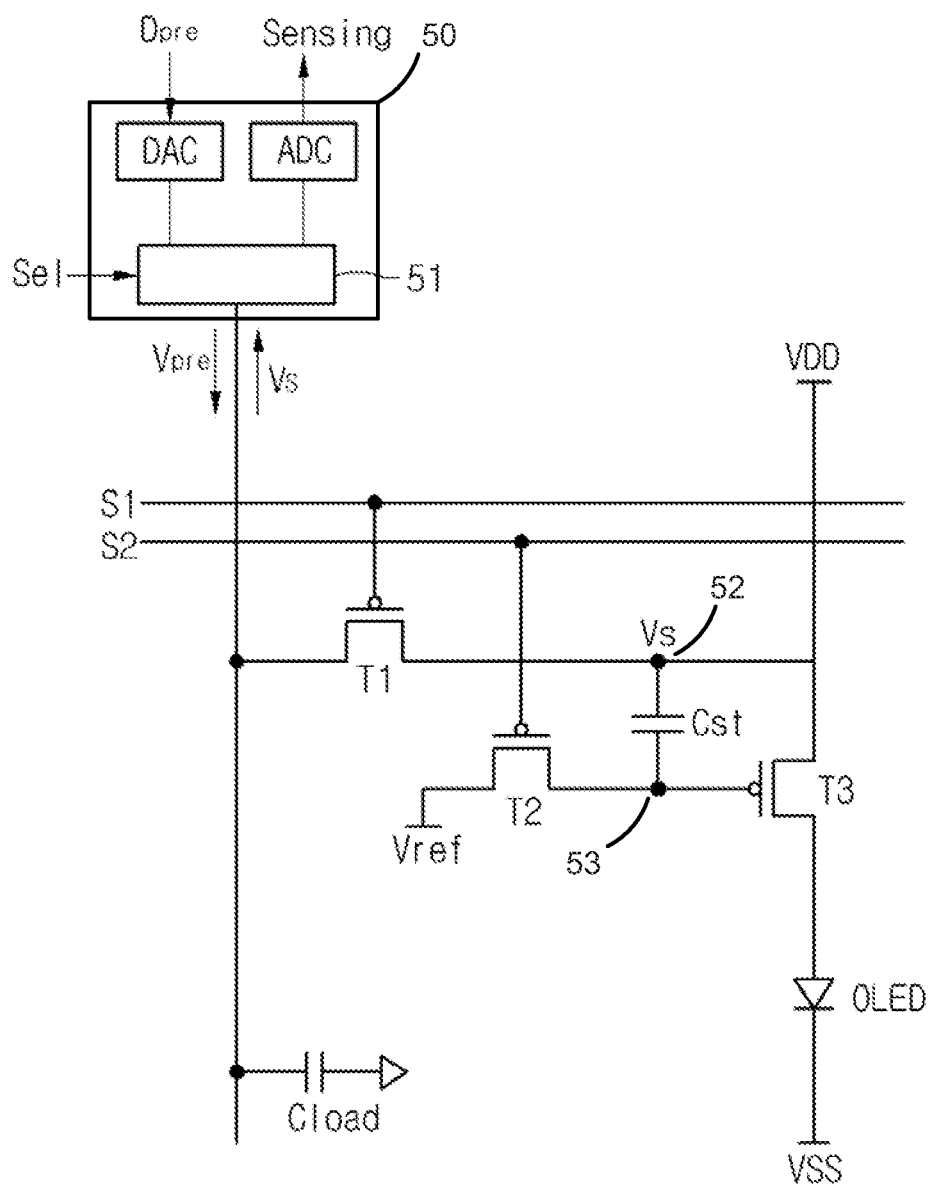
FIG. 8 illustrates a circuit diagram partially showing a pixel region and a data driver of the OLED device according to one embodiment.

FIG. 8 illustrates a circuit diagram partially showing a pixel region and a data driver of the OLED device according to the one embodiment. In one embodiment, the OLED device comprises a first transistor T1, a second transistor T2, a third transistor T3, a storage capacitor Cst, a load capacitor Cload and an organic light emission element "OLED" can be formed within each of the pixel regions P. Note that other embodiments of the OLED device may include different elements other than those illustrated in FIG. 8. In other words, the number of transistors and the connection configuration formed on the pixel region P can be modified in a variety of shapes. Therefore, the present embodiment can be applied to every modifiable circuit configuration of the pixel region by a designer.

The first transistor T1 and second transistor T2 may each function as a switching transistor which is used for transferring a signal. The third transistor T3 may function as a drive transistor that generates a drive current for driving the organic light emission element "OLED".

The storage capacitor Cst maintains a data voltage during a single frame period. The load capacitor Cload charges an externally provided pre-charge data voltage Vpre and applies the charged pre-charge data voltage Vpre to the organic light emission element "OLED". The organic light emission element "OLED" is used to generate light. The light generated in the organic light emission element "OLED" can have a brightness that is varied based on the strength of the drive current. The organic light emission element "OLED" can function as one of red, green and blue organic light emission elements.

The first through third transistors T1 through T3 may be a PMOS-type thin film transistor but may be other types of transistors such as NMOS-type thin film transistors in other embodiments. The first through third transistors T1 through T3 can be turned-on by a signal with a low level and turned-off by another high level signal. The high level can be either a ground voltage or another voltage close thereto. The low level can be a lower voltage than the ground voltage.

The first power supply voltage VDD may be a high level signal. The second power supply voltage VSS may be a low level signal. The first supply voltage VDD and second power supply voltage VSS may be direct current (DC) voltages that are stably maintained at fixed levels.

The load capacitor Cload may be coupled to the data line DL. As such, the pre-charge voltage Vpre or the data voltage Vdata can be charged in the load capacitor Cload.

The first transistor T1 includes a gate electrode coupled to the first scan line S1, a source electrode coupled to the data line, and a drain electrode coupled to a first node 52. The first scan line S1 is used to transfer a first scan signal. The first node 52 is used to form a source voltage of the third transistor T3.

The first transistor T1 can be turned-on by the first scan signal with the lower level which is applied from the first scan line S1. As such, the pre-charge voltage Vpre or the data voltage Vdata on the data line can be charged at the first node 52. The data voltage can be used for the display of an image.

The first node 52 can be commonly coupled to the drain electrode of the first transistor T1, the storage capacitor Cst, a source electrode of the third transistor T3 and the first power line VDD.

The second transistor T2 can include a gate electrode coupled to the second scan line S2, a source electrode coupled to a reference voltage line, and a drain electrode coupled to a second node 53. The second scan line S2 can be used to transfer a second scan signal. The reference voltage line transfers a reference voltage Vref.

The second transistor T2 can be turned-on by the second scan signal with the low level which is applied from the second scan line S2. At the same time, the second node 53 can be discharged by the reference voltage Vref. The second node 53 can be commonly coupled to the drain electrode of the second transistor T2 and the gate electrode of the third transistor T3.

The storage capacitor Cst can be connected between the first node 52 and the second node 53. The storage capacitor Cst can be used to vary the voltage at the second node 53 according to the variation of a voltage Vs charged at the first node 52.

The third transistor T3 can include the gate electrode coupled to the second node 53, a source electrode coupled to the first node 52 and the first power line VDD. The third transistor T3 generates the drive current varied along the voltage of the second node 53. The drive current generated by the third transistor T3 is applied to the organic light emission element "OLED". The organic light emission element "OLED" can emit light using the drive current.

Although not shown in FIG. 8, an additional switching transistor can further be disposed between the first power line and the source electrode of the third transistor T3 or may be disposed between the drain electrode of the third transistor T3 and an electrode of the OLED. The additional switching transistor can be switch-controlled by an emission control signal.

The data line DL is coupled to the data driver 50. The data driver 50 may include a digital-to-analog converter DAC, an analog-to-digital converter ADC, and a selection element 51.

The DAC can generate the pre-charge data voltage Vpre and the data voltage Vdata. The DAC can convert a pre-charge data signal Dpre and a data signal Ddata, which are digital signals, into the pre-charge data voltage Vpre and the data voltage Vdata which are analog signals. The ADC may convert an analog sensing signal, which is sensed in the pixel region, into a digital sensing signal. The selection element 51 selectively connects the data line DL with either the DAC or the ADC.

The selection element 51 may be switch-controlled by a selection signal Sel. For example, the selection element 51 can reply to the selection signal with the low level and control the data line DL to be electrically coupled to the DAC. On the contrary, the selection element 51 can reply to the selection signal with the high level and control the data line DL to be electrically coupled to the DAC.

In one embodiment, the pre-charge voltage Vpre is applied and the sensing voltage Vs is obtained, partially using the configurations of the pixel region and the data driver 50. This results because the pre-charge voltage with a small error can be applied and the sensing voltage Vs with a small error can be detected due to the uniform capacitance or the matching of the capacitances between the data lines. As such, characteristics of elements such as a threshold voltage Vth can be precisely measured and compensated for. Therefore, the display quality of the OLED device is enhanced.

Figure 9:
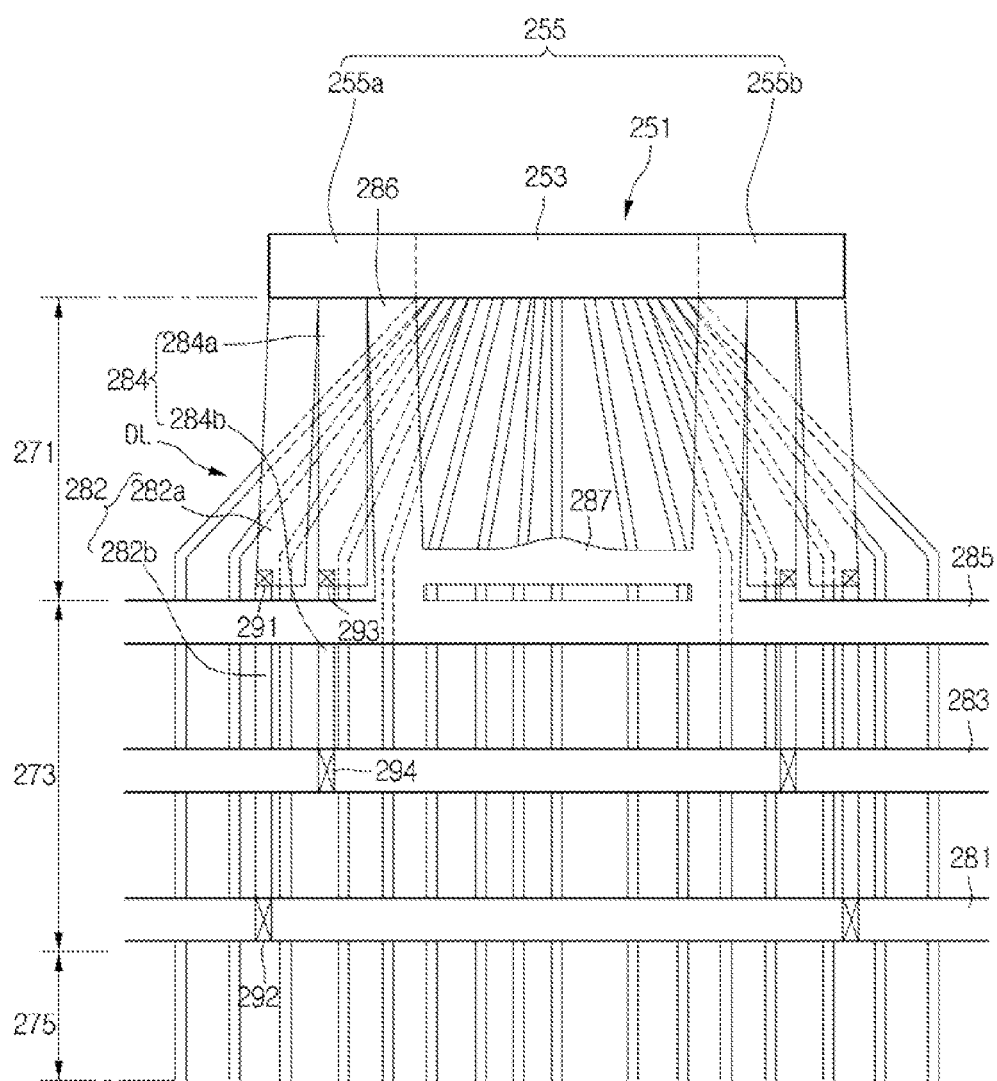
FIG. 9 illustrates a planar view showing a data link portion of the OLED device according to one embodiment.

FIG. 9 illustrates a planar view of a data link portion of the OLED device according to another embodiment. The embodiment shown in FIG. 9 is similar to the embodiment shown in FIG. 5 with the exception of forming an overlap pattern 287 between the third link lines which are positioned at both sides of the signal domain 253. Therefore, the description of similar elements from FIG. 5 that is shown in FIG. 9 will be omitted for ease of discussion.

In one embodiment, a driver IC chip 251 of the OLED device comprises a signal domain 253 occupying a central portion of the driver IC chip 251 and power domains 255 positioned at both sides of the signal domain 253.

A display area 275 used for displaying images may be provided below the driver IC chip 251. A first link area 271 and a second link area 273 can be provided between the driver IC chip 251 and the display area 275.

A first link line 282, a second link line 284, and a third link 286 can be formed in the first link area 271 and the second link area 273. The first through third link lines 282, 284 and 286 can be coupled to the power domain 255 of the driver IC chip 251. The first through third link lines 282, 284 and 286 can be formed in regions of the first and second link area 271 and 273 opposite to both the power domains of the driver IC chip 251.

In one embodiment, an overlap pattern 287 is formed between the third link lines 286 within the first link area 271. In one embodiment, the overlap pattern 287 is a region or area formed between the third link lines 286 within the first link area 271 that overlaps a plurality of data lines DL. There may be a plurality of overlapping regions between the third link lines 286 within the first link area 271 thereby forming a pattern of overlap.

The overlap pattern 287 can be formed with a fixed interval from the third link lines 286. The overlap pattern 287 can be formed along a parallel direction to the third power line 285. The overlap pattern 287 can be formed to extend from the third link lines 286. The overlap pattern can be formed to have a protruded central portion. The overlap pattern 287 can overlap with the data lines DL on a part of the first link area 271 opposite to the signal domain 253 of the driver IC chip 251. The overlap pattern 287 can be formed in a size suitable to minimize a capacitance deviation between the data lines coupled to the signal domain 253 and the power domains 255 (i.e., 255a and 255b) of the driver IC chip 251. Also, the overlap pattern 287 can be formed in such a manner as to consider a resistance deviation caused by a difference between the lengths of the data lines DL, so that a RC delay deviation between the data lines is minimized. In one embodiment, a data line coupled to the center of the signal domain 253 of the driver IC chip 251 has a smaller line resistance than that of another data line coupled to the outside of the signal domain 253, because of its shorter length. To this end, the overlap pattern 287 can be formed in such a manner that its central portion protrudes. The protruded central portion of the overlap pattern can reduce the RC delay deviation between the data lines DL. The data lines DL can be designed to have small deviations in the capacitance and the RC delay quantity using the overlap pattern 287. As such, the distortion of signals can be prevented, and the display quality of the OLED device is enhanced.

In this manner, the embodiment shown in FIG. 9 can allow the data lines DL to overlap with the overlap pattern, possibly uniformly maintaining the capacitance and the RC delay quantity between the data lines. Therefore, the display quality of the OLED device can be enhanced.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. An organic light emitting display device comprising:
    a data driver including a driver integrated circuit chip;
    a plurality of data lines coupled to the driver IC chip;
    at least a power line that crosses the data lines, wherein capacitances formed between each of the data lines and the power line are substantially equal;
    at least a link line that couples the power line and the driver IC chip, wherein the link line is directly connected to the driver IC chip; and
    an overlap pattern formed between the power line and the driver IC chip to overlap with at least part of the plurality of data lines.

2. The organic light emitting display device of claim 1, wherein a resistor circuit (RC) delay for each of the plurality of data lines is substantially equal across the plurality of data lines.

3. The organic light emitting display device of claim 1, wherein the power line includes an expansion portion that expands in a direction towards the driver IC chip to overlap the plurality of data lines.

4. The organic light emitting display device of claim 3, wherein the expansion portion is formed on a same layer as the power line within the organic light emitting display device.

5. The organic light emitting display device of claim 3, wherein the expansion portion overlaps data lines associated with a shorter distance from the driver IC chip to the power line more than data lines associated with a longer distance from the driver IC chip to the power line.

6. The organic light emitting display device of claim 5, wherein the data lines associated with the shorter distance comprise an irregular shape compared to the data lines associated with the longer distance such that a path length of the data lines associated with the shorter distance is the same as a path length of the data lines associated with the longer distance.

7. The organic light emitting display device of claim 6, wherein the data lines associated with the shorter distance and the data lines associated with the longer distance comprise substantially a same resistance.

8. The organic light emitting display device of claim 1,
    wherein the overlap pattern overlaps with the at least part of the data lines between the power line and the driver IC chip to minimize capacitance deviation between the at least part of the data lines.

9. The organic light emitting display device of claim 8, wherein the overlap pattern is parallel to the power line.

10. The organic light emitting display device of claim 8, wherein a portion of the overlap pattern protrudes in a direction towards the driver IC chip.

11. The organic light emitting display device of claim 1, wherein the driver IC chip comprises:

a signal domain that receives image signals; and power domains that provide power to a display panel of the organic light emitting display device;

wherein the power domains comprise a first power domain positioned at a first end of the signal domain and a second power domain positioned at a second end of the signal domain.

12. An organic light emitting display device comprising:

a substrate; plurality of data lines positioned on the substrate;

an insulation layer formed over the data lines;

a plurality of link lines and a plurality of power lines formed on the insulation layer, wherein the plurality of the data lines overlap the position of at least one of the plurality of link lines, wherein the plurality of link lines are coupled to the plurality of power lines and a driver integrated circuit IC chip, wherein the plurality of link lines are directly connected to the driver IC chip; and an overlap pattern formed between at least one of the power lines and the driver IC chip to overlap with at least part of the plurality of data lines.

13. The organic light emitting display device of claim 12, further comprising:

a buffer layer positioned on the substrate.

14. The organic light emitting display device of claim 13, further comprising:

a gate insulation film positioned on the buffer layer.

15. A method for manufacturing an organic light emitting display device, the method comprising:

positioning a substrate;

forming plurality of data lines positioned on the substrate;

forming an insulation layer over the data lines;

forming a plurality of link lines and a plurality of power lines on the insulation layer, wherein the plurality of the data lines are formed to overlap the position of at least one of the plurality of link lines, wherein the plurality of link lines are coupled to the plurality of power lines and a driver integrated circuit (IC) chip, wherein the plurality of link lines are directly connected to the driver IC chip; and an overlap pattern formed between at least one of the power lines and the driver IC chip to overlap with at least part of the plurality of data lines.

16. The method of claim 15, further comprising:

forming a buffer layer positioned on the substrate.

17. The method of claim 16, further comprising:

a gate insulation film positioned on the buffer layer.

* * * * *